(12) United States Patent
Nelle et al.

(10) Patent No.: US 9,165,921 B2
(45) Date of Patent: Oct. 20, 2015

(54) TRANSISTOR CELL ARRAY INCLUDING SEMICONDUCTOR DIODE

(71) Applicant: Infineon Technologies AG, Neubiberg (DE)

(72) Inventors: Peter Nelle, Munich (DE); Markus Zundel, Egmating (DE)

(73) Assignee: Infineon Technology AG, Neubiberg (DE)

( * ) Notice: Subject to any disclaimer, the term of this patent is extended or adjusted under 35 U.S.C. 154(b) by 110 days.

(21) Appl. No.: 13/716,784

(22) Filed: Dec. 17, 2012

(65) Prior Publication Data

US 2014/0167154 A1 Jun. 19, 2014

(51) Int. Cl.
*H01L 29/78* (2006.01)
*H01L 27/06* (2006.01)

(52) U.S. Cl.
CPC .................................. *H01L 27/0629* (2013.01)

(58) Field of Classification Search
CPC ...................... H01L 29/7813; H01L 29/42368; H01L 29/407; H01L 29/41766; H01L 29/4236
USPC ............ 257/60, 329–335, 340, 341, 489–496
See application file for complete search history.

(56) References Cited

U.S. PATENT DOCUMENTS 8,080,858 B2 * 12/2011 Hirler et al. .................... 257/487

* cited by examiner

*Primary Examiner* — Monica D Harrison
(74) *Attorney, Agent, or Firm* — Murphy, Bilak & Homiller, PLLC

(57) ABSTRACT

One embodiment of a semiconductor device includes a dense trench transistor cell array. The dense trench transistor cell array includes a plurality of transistor cells in a semiconductor body. A width $w_3$ of a transistor mesa region of each of the plurality of transistor cells and a width $w_1$ of a first trench of each of the plurality of transistor cells satisfy the following relationship: $w_3 < 1.5 \times w_1$. The semiconductor device further includes semiconductor diodes. At least one of the semiconductor diodes is arranged between first and second parts of the plurality of transistor cells and includes a diode mesa region adjoining opposing walls of second trenches. A depth $d_1$ of the first trench and a depth $d_2$ of the second trenches differ by at least 20%.

11 Claims, 8 Drawing Sheets

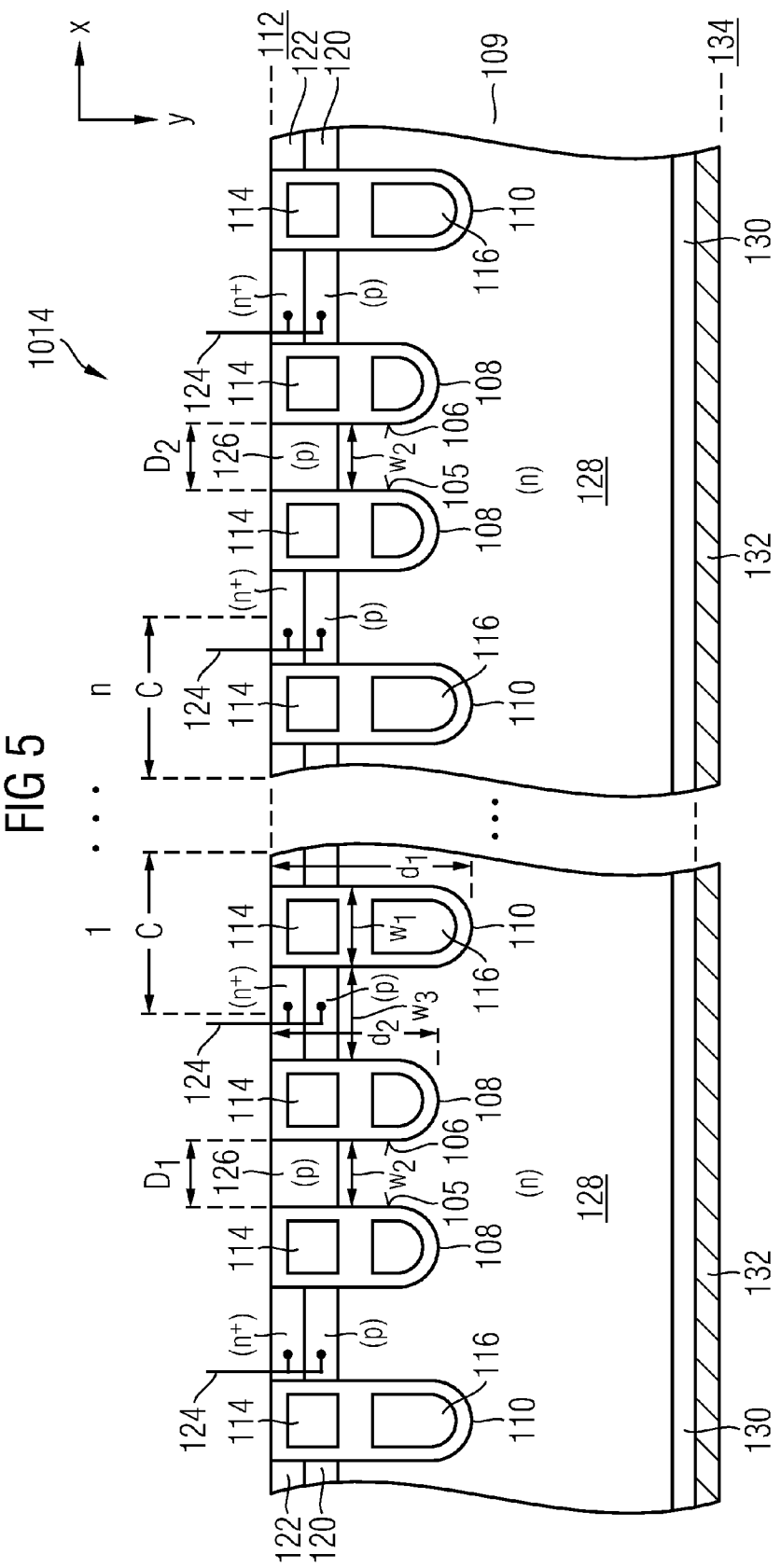

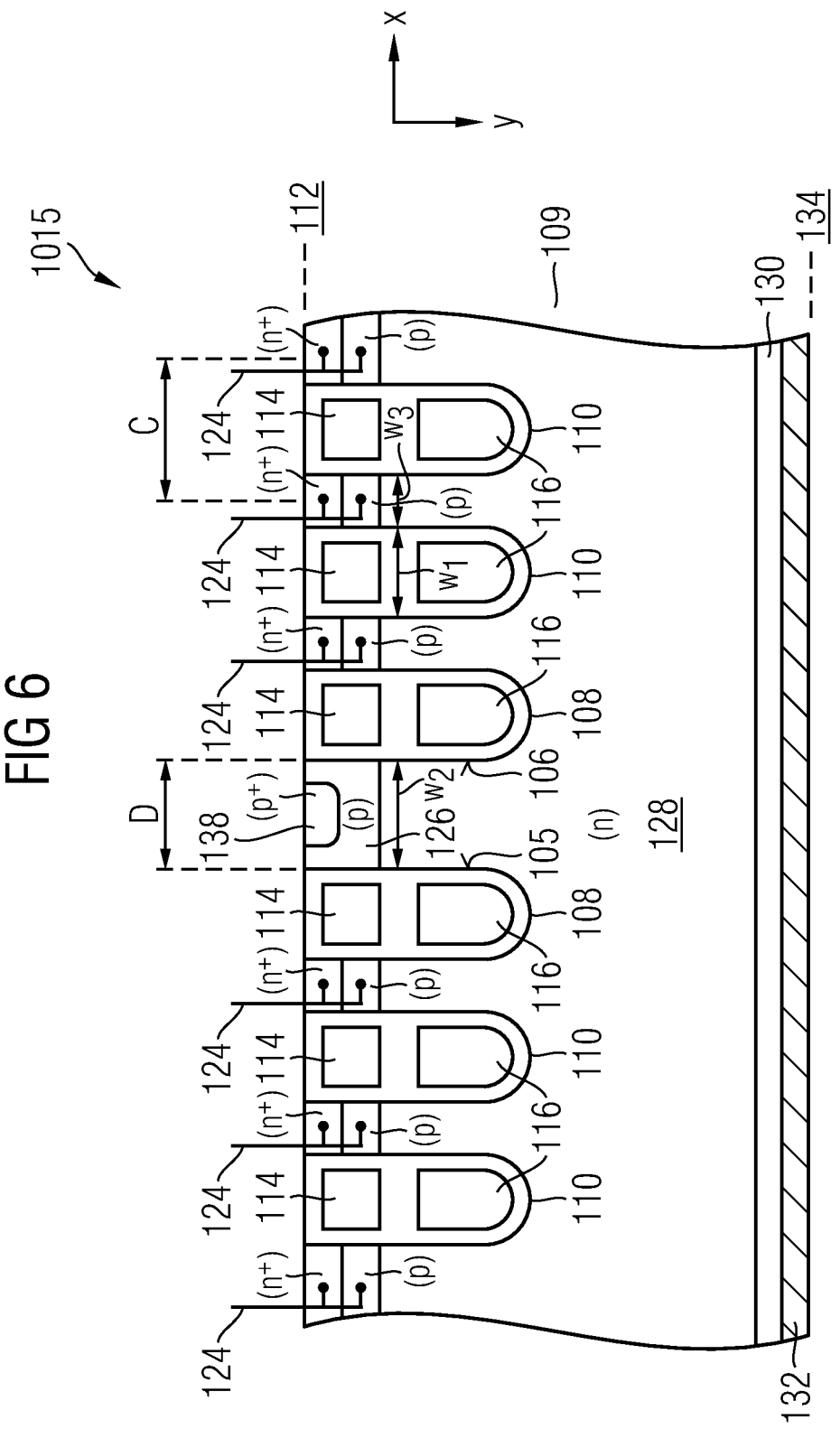

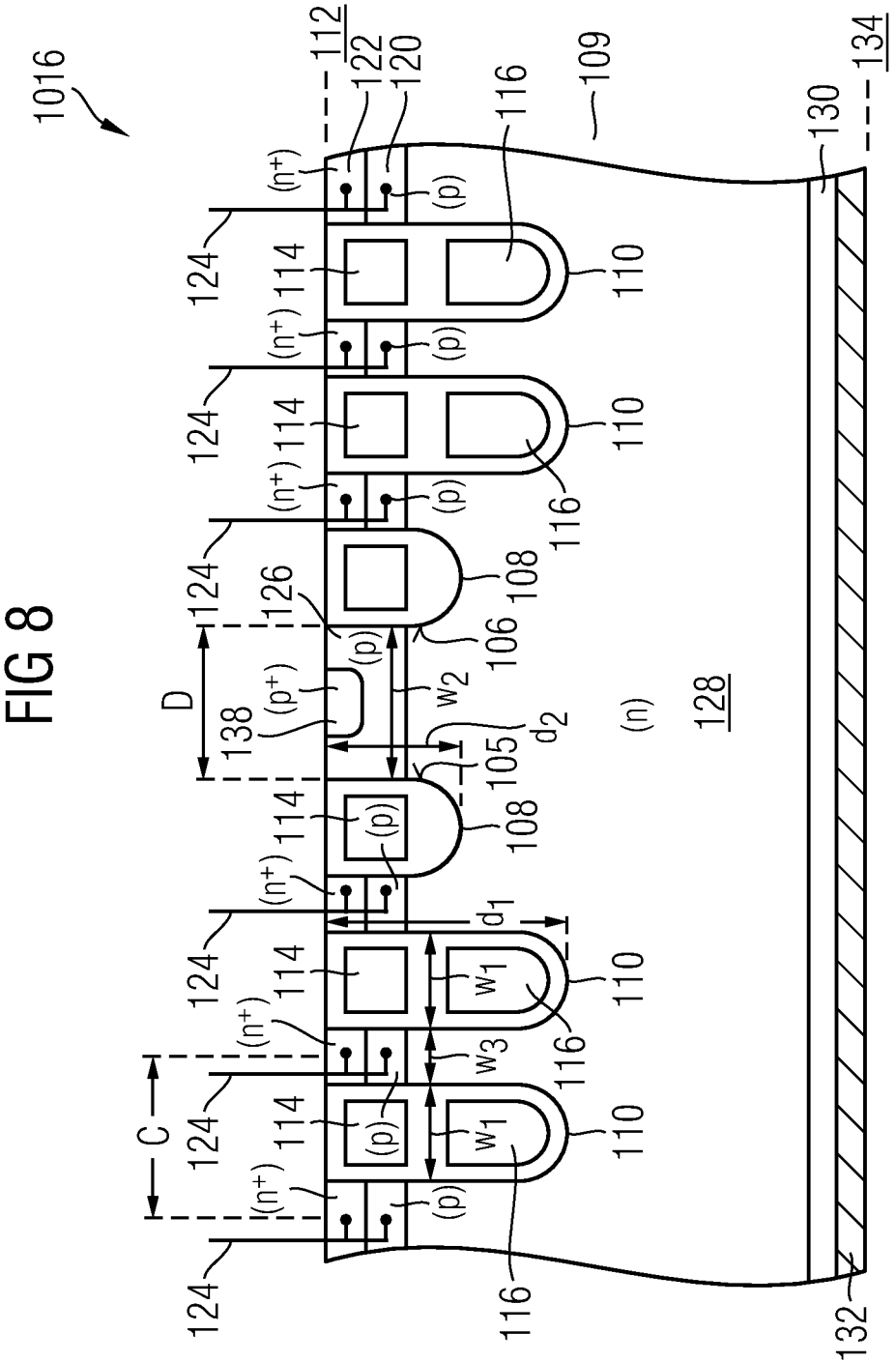

TRANSISTOR CELL ARRAY INCLUDING SEMICONDUCTOR DIODE

BACKGROUND

The development of new generations of field effect transistors (FETs) is a driven by the reduction of the area specific on-state resistance $R_{on} \times A$. Since a well-defined breakdown characteristic and a high avalanche strength are also desirable in view of reliability requirements, optimization of the transistor cell layout with respect to the breakdown characteristic is required. As an example, in dense trench transistors a narrow mesa region leads to an electrical breakdown in an area around a bottom side of the trenches. When optimizing dense trench transistors with respect to area specific on-state resistance and well-defined avalanche breakdown characteristics, a trade-off between a number of device layout parameters has to be met.

There is a need for a semiconductor device having an improved trade-off between area specific on-state resistance and avalanche strength.

SUMMARY

According to an embodiment, a semiconductor device includes a dense trench transistor cell array. The dense trench transistor cell array includes a plurality of transistor cells in a semiconductor body. A width $w_3$ of a transistor mesa region of each of the plurality of transistor cells and a width $w_1$ of a first trench of each of the plurality of transistor cells satisfy the following relationship: $w_3 < 1.5 \times w_1$. The semiconductor device further includes semiconductor diodes. At least one of the semiconductor diodes is arranged between first and second parts of the plurality of transistor cells and includes a diode mesa region adjoining opposing walls of second trenches. A depth $d_1$ of the first trench and a depth $d_2$ of the second trenches differ by at least 20%.

According to another embodiment of a semiconductor device, the semiconductor device includes a dense trench transistor cell array. The dense trench transistor cell array includes a plurality of transistor cells in a semiconductor body. A width $w_3$ of a transistor mesa region of each of the plurality of transistor cells and a width $w_1$ of a first trench of each of the plurality of transistor cells satisfy the following relationship: $w_3 < 1.5 \times w_1$. The semiconductor device further includes semiconductor diodes. At least one of the semiconductor diodes is arranged between first and second parts of the plurality of transistor cells and includes a diode mesa region adjoining opposing walls of second trenches. A width $w_3$ of the transistor mesa region and a width $w_2$ of the diode mesa region differ by at least 20%.

According to yet another embodiment of a semiconductor device, the semiconductor device includes a dense trench transistor cell array. The dense trench transistor cell array includes a plurality of transistor cells in a semiconductor body. A width $w_3$ of a transistor mesa region of each of the plurality of transistor cells and a width $w_1$ of a first trench of each of the plurality of transistor cells satisfy the following relationship: $w_3 < 1.5 \times w_1$. The semiconductor device further includes semiconductor diodes. At least one of the semiconductor diodes is arranged between first and second parts of the plurality of transistor cells and includes a diode mesa region adjoining opposing walls of second trenches. The first trench includes $n_1$ electrodes, wherein $n_1 \geq 1$, and each of the second trenches includes $n_2$ electrodes, wherein $n_2 \leq n_1 - 1$.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other.

Embodiments are depicted in the drawings and are detailed in the description which follows.

FIG. 5 illustrates a schematic cross-sectional view of one embodiment of a semiconductor device similar to FIG. 1 and further including n dense trench transistor cells arranged between neighboring two semiconductor diodes.

FIG. 6 illustrates a schematic cross-sectional view of one embodiment of a semiconductor device including a dense trench transistor cell array and a semiconductor diode adjoining opposing walls of trenches and having a width $w_3$ of a diode mesa region greater than a width $w_2$ of a transistor mesa region.

FIG. 8 illustrates a schematic cross-sectional view of one embodiment of a semiconductor device similar to FIG. 6 and further including a field electrode in a gate trench of the dense transistor cell array that is absent in the trenches adjoining the semiconductor diode.

DETAILED DESCRIPTION

Figure 1:
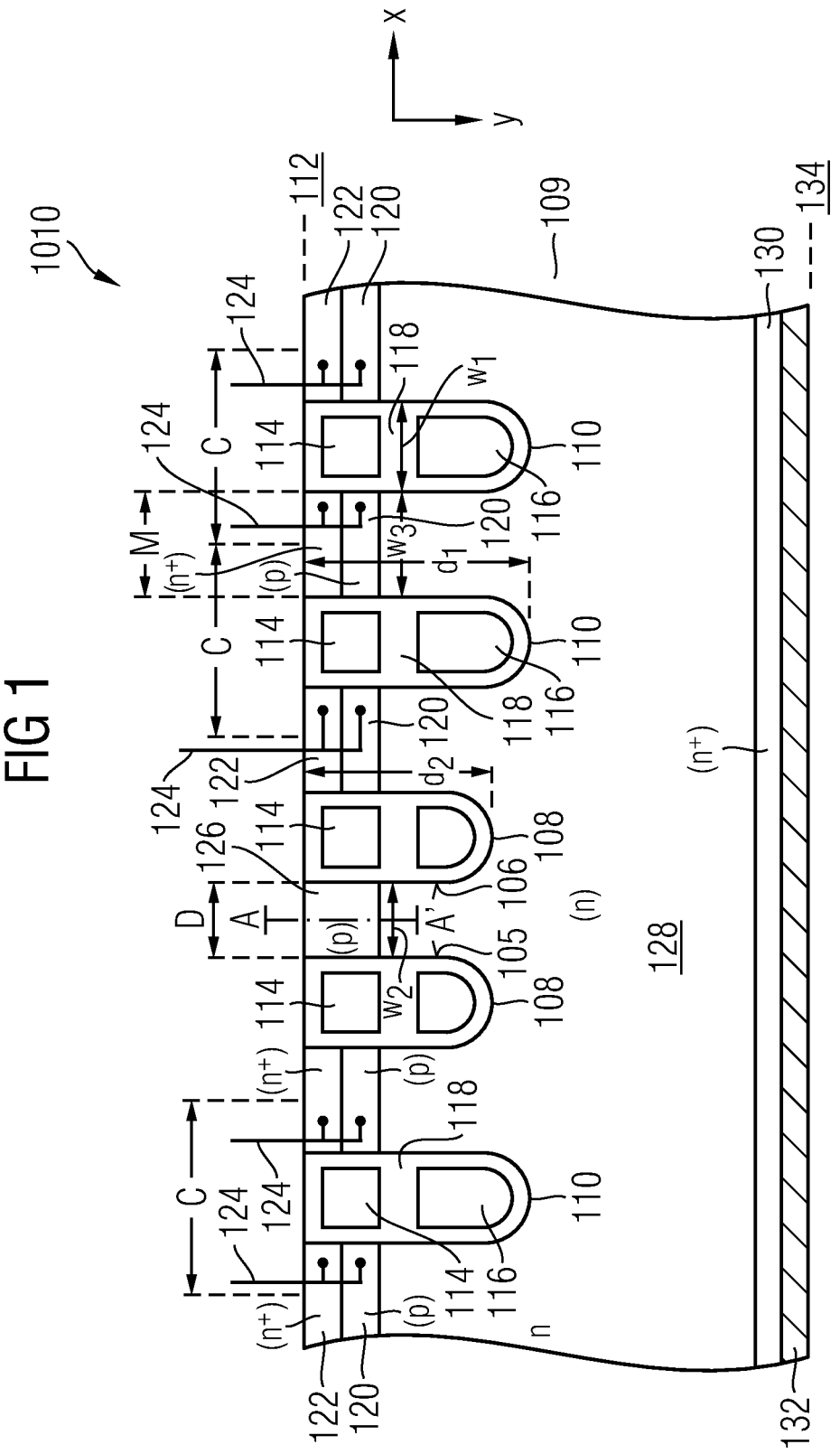
FIG. 1 illustrates a schematic cross-sectional view of one embodiment of a semiconductor device including a dense trench transistor cell array and a semiconductor diode adjoining opposing walls of trenches having a depth $d_2$ smaller than a depth $d_1$ of a gate trench in the dense trench transistor cell array.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", "over", "above", "below", etc., is used with reference to the orientation of the Figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As employed in this specification, the terms "coupled" and/or "electrically coupled" are not meant to mean that the elements must be directly coupled together—intervening elements may be provided between the "coupled" or "electrically coupled" elements. As an example, none, part or all of the intervening element(s) may be controllable to provide a low-ohmic connection and, at another time, a non-low-ohmic connection between the "coupled" or "electrically coupled" elements. The term "electrically connected" intends to describe a low-ohmic electric connection between the elements electrically connected together, e.g., a connection via a metal and/or highly doped semiconductor.

In this specification, n-doped may refer to a first conductivity type while p-doped is referred to a second conductivity type. It goes without saying that the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. Indicating the relative doping concentration does not, however, mean that doping regions of the same relative doping concentration have the same absolute doping concentration unless otherwise stated. For example, two different n+-doped regions can have different absolute doping concentrations. The same applies, for example, to an n+-doped and a p+-doped region.

FIG. 1 illustrates a schematic cross-sectional view of one embodiment of a semiconductor device 1010 including a dense trench transistor cell array and a semiconductor diode D adjoining opposing walls 105, 106 of trenches 108 having a depth $d_2$ smaller than a depth $d_1$ of a gate trench 110 in the dense trench transistor cell array. The term depth of a trench is defined as a distance between a vertex at a bottom of the trench to a top side of a mesa region abutting the trench. The top side of the mesa region is an interface where semiconductor material of the mesa region is covered with a dielectric.

The dense trench transistor cell array and the semiconductor diode D are formed in a semiconductor body 109 that may include a semiconductor substrate, e.g. a silicon (Si) substrate or a semiconductor compound substrate, e.g. a SiC or III-V compound semiconductor substrate. One or a plurality of semiconductor layer(s), e.g. epitaxial semiconductor layers may be formed on the semiconductor substrate.

The dense trench transistor cell array includes a plurality of transistor cells C. A width $w_3$ of each transistor mesa region M and a width $w_1$ of the gate trench 110 at the first side 112 satisfy the following relationship: $w_3 < 1.5 \times w_1$. The term width of a mesa region is defined as an average of three widths, i.e. a first width at 20% of a depth of a trench abutting the mesa region, a second width at 50% of a depth of a trench abutting the mesa region and a third width at 80% of a depth of a trench abutting the mesa region. The definition of width of a mesa region applies likewise to a width of a trench. Each of the transistor cells C includes the gate trench 110 extending along a vertical direction y into the semiconductor body 109 from a first side 112, e.g. a front side. The gate trench 110 includes a gate electrode 114 and a field electrode 116 electrically isolated by a dielectric structure 118. The dielectric structure 118 may include a plurality of dielectric materials and/or layers, e.g. a field dielectric such as a field oxide in a bottom part of the gate trench 110 surrounding the field electrode 116 and a gate dielectric such as a gate oxide in a top part of the trench between the gate electrode 114 and a surrounding part of the semiconductor body 109. The field electrode 116 is optional and other embodiments may, depending upon e.g. requirements on a voltage blocking capability of the device, include none or even more than one field electrode. In the trenches 108 one or a plurality of field electrodes may also be present below the gate electrode 114.

The transistor mesa region M of each transistor cell C includes a p-doped body region 120 and an n+-doped source region 122. The p-doped body region 120 and the n+-doped source region 122 are electrically coupled to a contact 124 at the first side 112. The contact 124 is illustrated in a simplified manner in FIG. 1 and may include a trench contact adjoining the n+-doped source region 122 at sidewalls of the trench contact and adjoining the p-doped body region 120 at a bottom side of the trench contact. As a further example, the contact 124 may electrically contact the n+-doped source region 122 in a first surface area at the first side 112 and the p-doped body region 120 at a second surface area at the first side 112. In other words, the n+-doped source region 122 and the p-doped body region 120 adjoin different surface areas at the first side 112. As an example, the n+-doped source region 122 may be manufactured by a masked implantation of ions into the semiconductor body 109.

The semiconductor diode D is located between transistor cells C of the dense trench transistor cell array. The semiconductor diode D includes a p-doped anode region 126. According to one embodiment, the p-doped anode region 126 and the p-doped body region 120 are processed simultaneously, e.g. by one or more ion implantation and/or diffusion processes. According to another embodiment, the p-doped anode region 126 may include other or additional doping processes compared to the p-doped body region 120. According to one embodiment, the p-doped anode region 126 and the p-doped body region 120 are electrically coupled, e.g. short-circuited. Thus, the transistor cells C and the semiconductor diode D are connected in parallel.

An n-doped drift zone 128 forms part of the semiconductor body 109. A part of the n-doped drift zone 128 in an area of the semiconductor diode D constitutes part of a cathode region of the diode D. The n-doped drift zone 128 is electrically coupled via an n+-doped contact zone 130 to a contact 132, e.g. a metal or metal alloy layer stack at a second side 134 opposite to the first side 112.

In dense trench transistor cells, avalanche breakdown starts around a bottom side of the gate trench 110. By adjusting the depth $d_2$ of the trenches 108 adjoining the semiconductor diode D smaller than the depth $d_1$ of the gate trench 110 in the dense trench transistor cell array, avalanche breakdown is shifted from the dense trench transistor cells C to an area of the semiconductor diode D, e.g. a center along a lateral direction of a diode mesa region. According to one embodiment a difference between the depth $d_1$ and the depth $d_2$ is appropriately chosen so that an electrical breakdown voltage $V_{br1}$ between the p-doped body region 120 and the n-doped drift zone 128 and an electrical breakdown voltage $V_{br2}$ between the anode region 126 and the cathode region of the semiconductor diode D satisfy the following relationship: $5 V \leq V_{br1} - V_{br2} \leq 20 V$.

Reduction of the depth $d_2$ of the trenches 108 adjoining the semiconductor diode D compared to the depth $d_1$ of the gate trench 110 allows for maintenance of the dense trench transistor cell concept while shifting avalanche breakdown away from the dense trench transistor cells C to the semiconductor diode D. Thereby, unintended drifting of electrical device parameters such as drifting of breakdown voltage and/or threshold voltage in the transistor cell array due to capture of hot carriers in a field oxide and/or gate oxide of the dielectric structure 118 can be avoided and/or counteracted.

According to one embodiment, a number of dense trench transistor cells C between two neighboring semiconductor diodes is in a range of 2 to 20. As an example, an alternating layout of dense trench transistor cells C and semiconductor diodes D may be applied. Since in a stripe-array layout a width of dense trench transistor cell stripes is rather small, e.g. in a range between 2 to 15 μm, heat generated during avalanche breakdown of the semiconductor diodes is thermally conducted into the dense trench transistor cell array and dissipated not only in the semiconductor diode D but also all over the dense trench transistor cell array.

Apart from decreasing the depth $d_2$ of the trenches 108 adjoining the semiconductor diode D, alternative and/or additional measures may be taken to shift avalanche breakdown from the dense trench transistor cell array to the semiconductor diode D.

Figure 2:
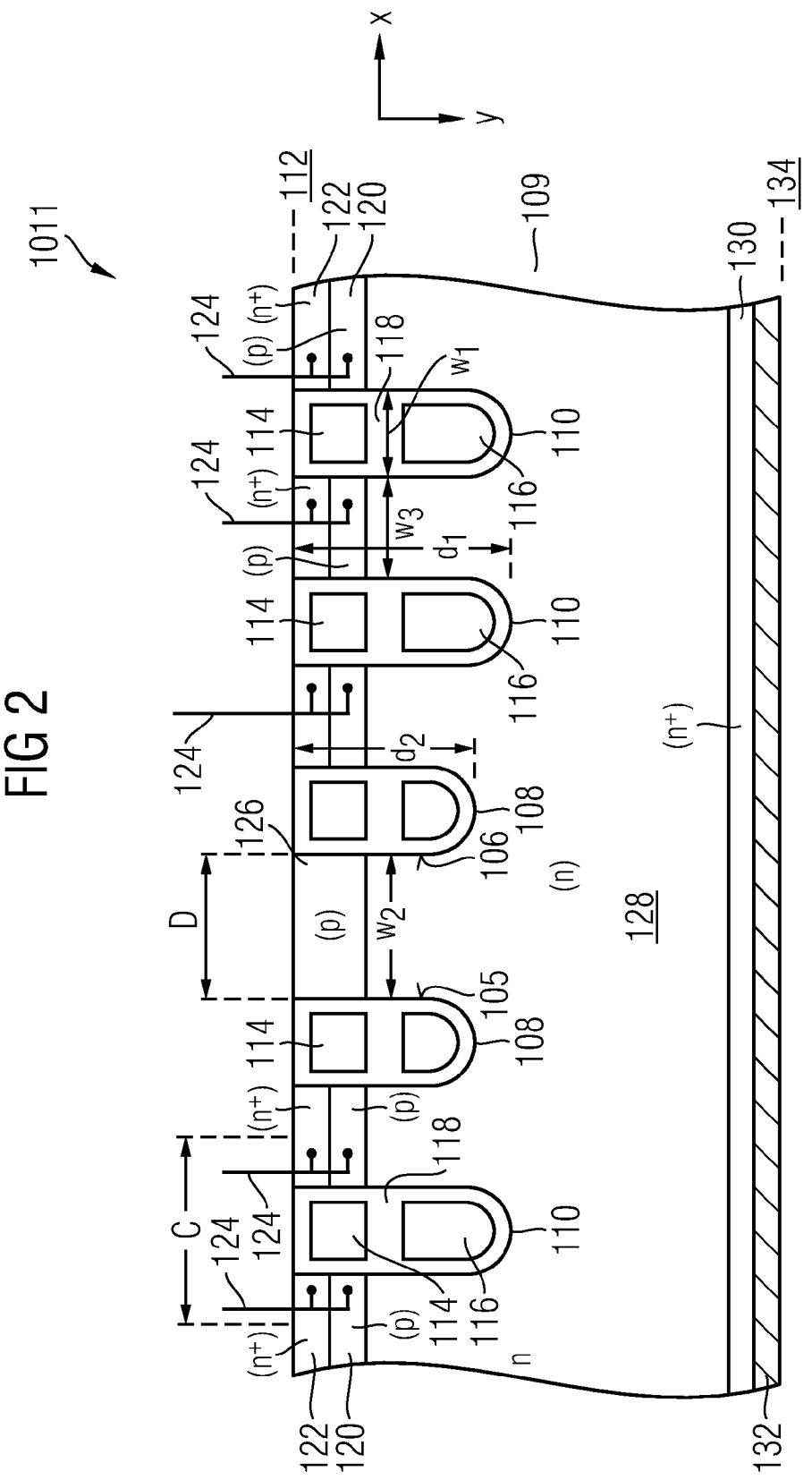
FIG. 2 illustrates a schematic cross-sectional view of one embodiment of a semiconductor device similar to FIG. 1 and further including a width $w_3$ of a transistor mesa region smaller than a width $w_2$ of a diode mesa region.

FIG. 2 illustrates a schematic cross-sectional view of one embodiment of a semiconductor device 1011. Apart from structural features similar to the embodiment illustrated in FIG. 1, the width $w_3$ of the transistor mesa region M is smaller by at least 20% than a width $w_2$ of a mesa region of the semiconductor diode D. By increasing the width $w_2$ of the mesa region of the semiconductor diode D, the electrical breakdown voltage $V_{br2}$ of the semiconductor diode D can be further decreased compared to the breakdown voltage $V_{br1}$ of the dense trench transistor cell C. Thus, a combination of measures, i.e. decreasing the depth $d_2$ compared to the depth $d_1$ and increasing the width $w_2$ compared to the width $w_3$ allows for a shift of the avalanche breakdown from the dense transistor cell array to the semiconductor diode D. Increasing the width $w_2$ further allows for an increase of the avalanche breakdown area of the semiconductor diode D. This leads to an increase of a current capability of the semiconductor diode D.

Apart from increasing the width $w_2$ compared to $w_3$, the width $w_2$ may also be decreased compared to the width $w_3$ when overcompensating this effect on the breakdown voltage by a further reduction of the depth $d_2$ of the trenches 108 compared to the depth $d_1$ of the gate trench 110. According to an embodiment, the widths $w_2$ and $w_3$ differ by at least 20%.

Figure 3:
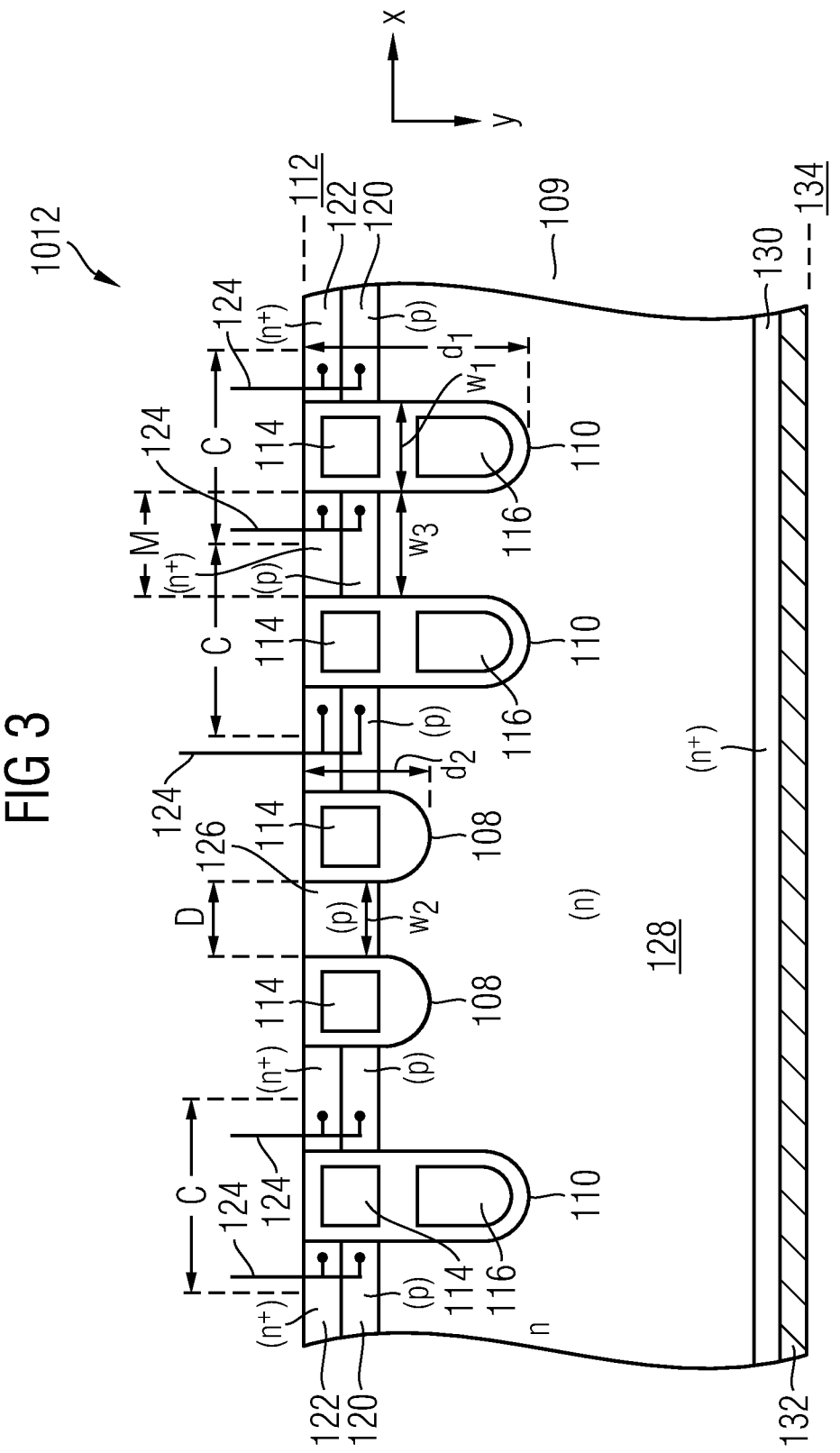
FIG. 3 illustrates a schematic cross-sectional view of one embodiment of a semiconductor device similar to FIG. 1 and further including a field electrode in a gate trench of the dense transistor cell array that is absent in the trenches adjoining the semiconductor diode.

FIG. 3 illustrates a schematic cross-sectional view of one embodiment of a semiconductor device 1012. Apart from structural features similar to the embodiment illustrated in FIG. 1, a number of electrodes in the gate trench 110 is larger than a number of electrodes in each of the trenches 108. Whereas the gate trench 110 illustrated in FIG. 3 includes the field electrode 116 and the gate electrode 114, each of the trenches 108 lacks the field electrode 116. According to one embodiment, wherein the gate trench 110 includes $n_1$ electrodes, wherein $n_1 \geq 1$, and each of the second trenches includes $n_2$ electrodes, wherein $n_2 \leq n_1 - 1$.

When increasing the number of electrodes in the gate trench 110 compared to the number of electrodes in the trenches 108 adjoining the diode, the electrical breakdown voltage $V_{br2}$ of the semiconductor diode D can be decreased compared to the breakdown voltage $V_{br1}$ of the dense trench transistor cell C. This leads to the benefit of shifting the avalanche breakdown away from the dense transistor cell array to the semiconductor diode D. Thereby, unintended drifting of electrical device parameters such as drifting of breakdown voltage and/or threshold voltage in the transistor cell array due to capture of hot carriers in a field oxide and/or gate oxide of the dielectric structure 118 can be avoided and/or counteracted.

Figure 4:
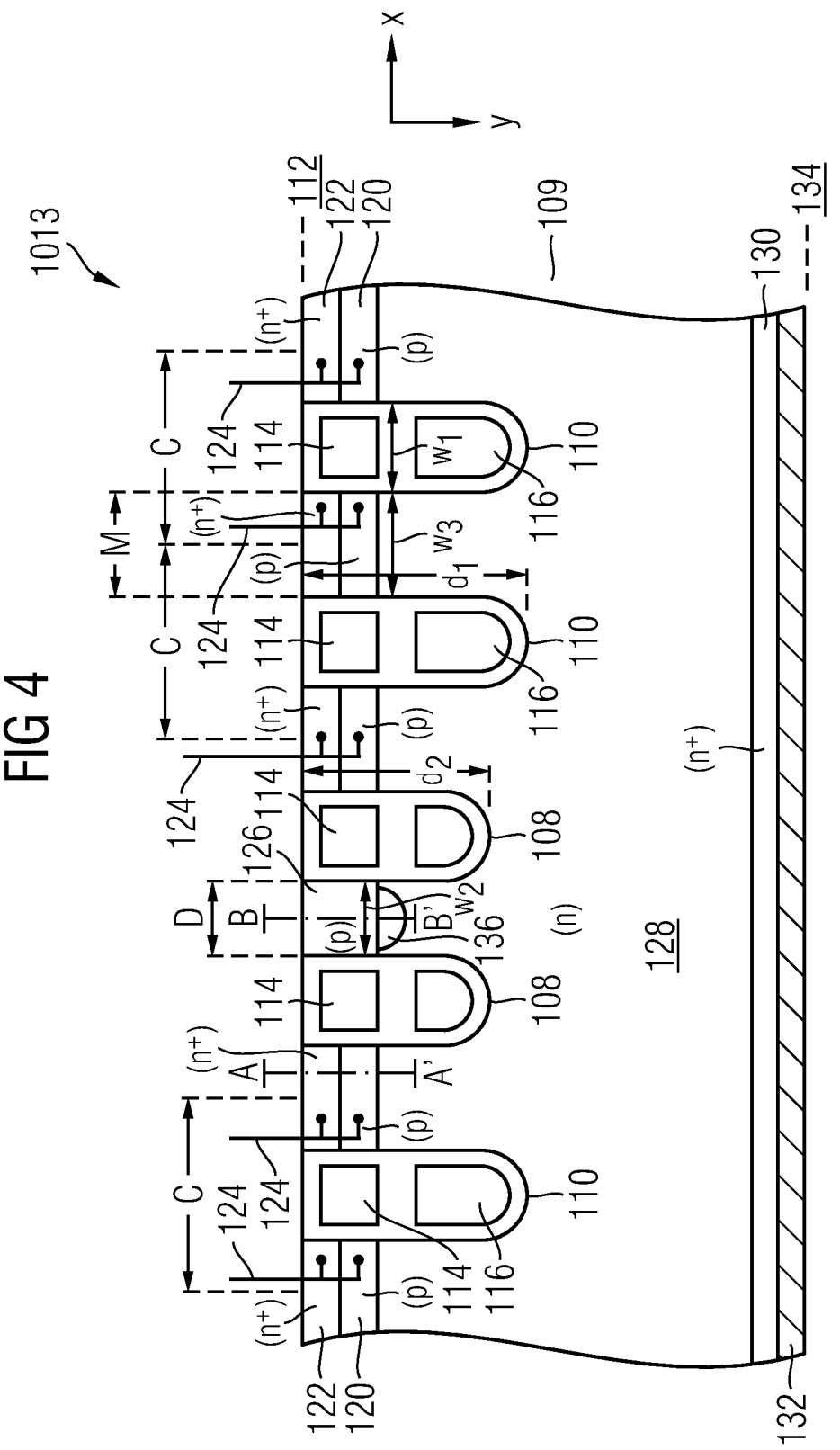
FIG. 4 illustrates a schematic cross-sectional view of one embodiment of a semiconductor device similar to FIG. 1 and further including a buried doped zone in the semiconductor diode.

FIG. 4 illustrates a schematic cross-sectional view of one embodiment of a semiconductor device 1013. Apart from structural features similar to the embodiment illustrated in FIG. 1, the semiconductor device 1013 includes a buried doped zone 136 in the semiconductor diode D at a junction between the anode region 126 and the cathode region being part of the n-doped drift zone 128. According to one embodiment, the buried doped zone 136 leads to an increased p-doping in the anode region 126 at the junction between the anode region 126 and the cathode region. According to another embodiment, the buried doped zone 136 leads to an increased n-doping in the cathode region at the junction between the anode region 126 and the cathode region.

When forming the buried doped zone 136 as described above, the electrical breakdown voltage $V_{br2}$ of the semiconductor diode D can be decreased compared to the breakdown voltage $V_{br1}$ of the dense trench transistor cell C. This leads to the benefit of shifting the avalanche breakdown away from the dense transistor cell array to the semiconductor diode D. Thereby, unintended drifting of electrical device parameters such as drifting of breakdown voltage and/or threshold voltage in the transistor cell array due to capture of hot carriers in a field oxide and/or gate oxide of the dielectric structure 118 can be avoided and/or counteracted.

FIG. 5 illustrates a schematic cross-sectional view of one embodiment of a semiconductor device 1014. Apart from structural features similar to the embodiment illustrated in FIG. 1, the semiconductor device 1013 includes n dense trench transistor cells arranged between neighboring two semiconductor diodes $D_1$ and $D_2$. According to one embodiment, the number n ranges between 2 to 20. A layout of the dense trench transistor cells C and the diodes $D_1$ and $D_2$ may be a stripe-shaped layout. According to other embodiments, the layout of the dense trench transistor cells C may also be polygonal.

FIG. 6 illustrates a schematic cross-sectional view of one embodiment of a semiconductor device 1015 including a dense trench transistor cell array and a semiconductor diode D adjoining opposing walls 105, 106 of trenches 108 having a same depth as gate trenches 110 in the dense trench transistor cell array. An electrical breakdown voltage $V_{br2}$ of the semiconductor diode D can be decreased compared to the breakdown voltage $V_{br1}$ of the dense trench transistor cells C by adjusting a width $w_2$ of a mesa region of the semiconductor diode D greater than the width $w_3$ of the mesa regions of the dense trench transistor cells C. This leads to the benefit of shifting the avalanche breakdown away from the dense transistor cell array to the semiconductor diode D. Thereby, unintended drifting of electrical device parameters such as drifting of breakdown voltage and/or threshold voltage in the transistor cell array due to capture of hot carriers in a field oxide and/or gate oxide of the dielectric structure 118 can be avoided and/or counteracted.

An optional p+-doped anode contact region 138 may be embedded into the p-doped anode region 126 for electrically coupling the p-doped anode region 126 to a conductive layer in a wiring area above the first side 112. The optional p+-doped anode contact region 138 may also be used as an intermediate region supporting electrical contact between the p-doped body region 120 and a conductive layer in a wiring area above the first side 112. The optional p+-doped anode contact region 138 may also be present in any of the embodiments described above or below.

Figure 7A:
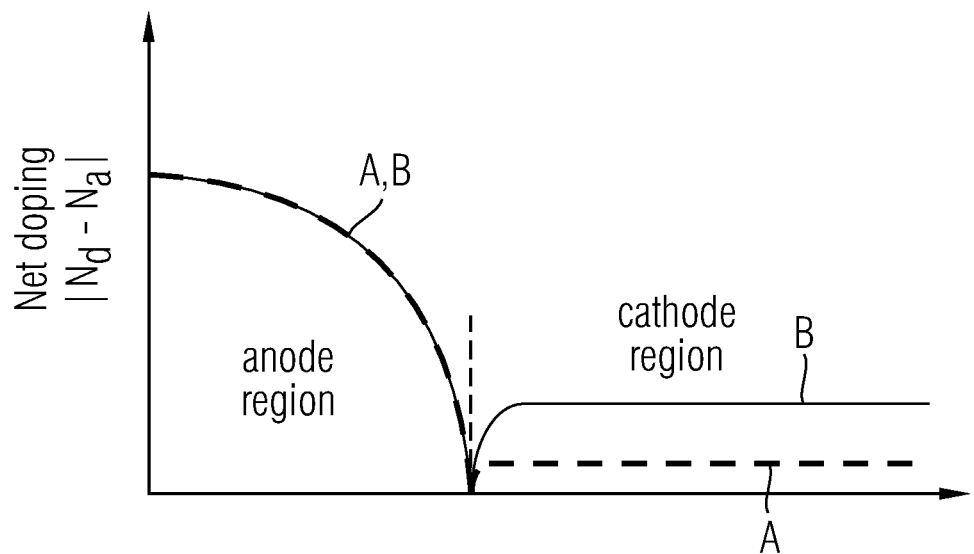
FIG. 7A illustrates schematic graphs of examples of net doping profiles along lines AA' and BB' illustrated in FIGS. 1 and 4.

FIG. 7A illustrate schematic graphs of examples of net doping profiles along lines AA' and BB' illustrated in FIGS. 1 and 4. In FIG. 7A, label A denotes a net doping curve along line AA' of a mesa region of the semiconductor diode D illustrated in FIG. 1. In FIG. 7A, label B denotes a net doping curve along line BB' of a mesa region of the semiconductor diode D illustrated in FIG. 4. In the illustrated embodiment, the buried doped zone 136 leads to an increase of a level of doping in the cathode region of the semiconductor diode D illustrated in FIG. 4 compared to the cathode region of the semiconductor diode D illustrated in FIG. 1. This causes a further decrease of the breakdown voltage $V_{br2}$ between the anode region and the cathode region in the semiconductor diode D of FIG. 4 compared to the semiconductor diode D of FIG. 1 and is, thus, one more measure of shifting avalanche breakdown from dense trench transistor cells C to the semiconductor diode D.

According to another embodiment, the buried doped zone 136 may also be combined with other measures for decreasing a breakdown voltage of the semiconductor diode D. In this case, the buried doped zone 136 may also include compensation dopants leading to a decrease of net doping in the respective region. This may still lead to a decrease in the breakdown voltage of the semiconductor diode if combined with other measures for decreasing a breakdown voltage of the semiconductor diode D.

Figure 7B:
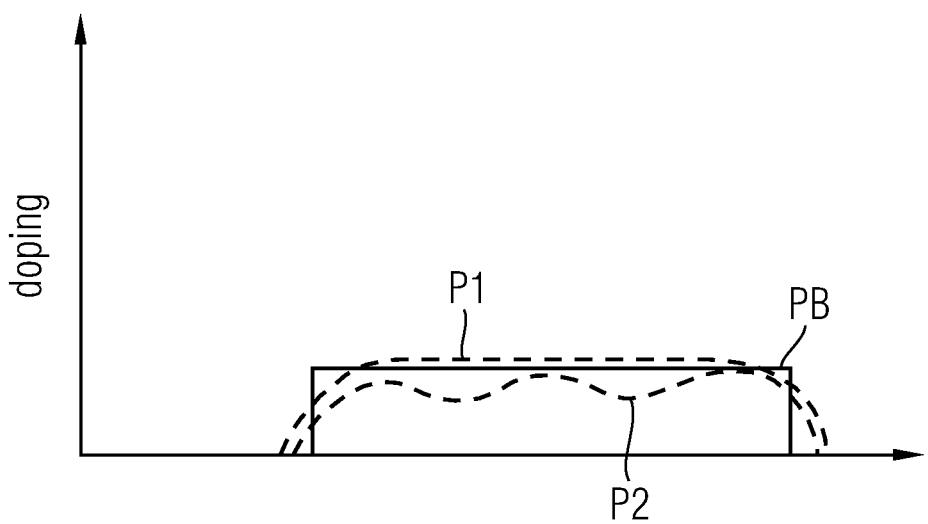
FIG. 7B illustrates exemplary graphs of dopant profiles of a buried doped zone at a pn junction of the semiconductor diode D illustrated in FIG. 4.

FIG. 7B illustrates examples of doping profiles of the buried doped zone 136. Whereas profiles P1 and P2 are close to a box profile PB, profile P1 is based on a single implant and outdiffusion leading to a broad plateau, profile P2 is based on multiple implants at different implant energies leading to overlapping sub profiles during outdiffusion. These profiles may be adjusted to any desired breakdown voltage of the semiconductor diode D.

FIG. 8 illustrates a schematic cross-sectional view of one embodiment of a semiconductor device 1016. Apart from structural features similar to the embodiment illustrated in FIG. 6, a number of electrodes in the gate trench 110 is larger than a number of electrodes in each of the trenches 108. Whereas the gate trench 110 illustrated in FIG. 6 includes the field electrode 116 and the gate electrode 114, each of the trenches 108 lacks the field electrode 116. According to one embodiment, wherein the gate trench 110 includes $n_1$ electrodes, wherein $n_1 \geq 1$, and each of the second trenches includes $n_2$ electrodes, wherein $n_2 \leq n_1 - 1$.

When increasing the number of electrodes in the gate trench 110 compared to the number of electrodes in the trenches 108 adjoining the diode, the electrical breakdown voltage $V_{br2}$ of the semiconductor diode D can be decreased compared to the breakdown voltage $V_{br1}$ of the dense trench transistor cell C. This leads to the benefit of shifting the avalanche breakdown away from the dense transistor cell array to the semiconductor diode D. Thereby, unintended drifting of electrical device parameters such as drifting of breakdown voltage and/or threshold voltage in the transistor cell array due to capture of hot carriers in a field oxide and/or gate oxide of the dielectric structure 118 can be avoided and/or counteracted.

Features of the above described embodiments may be combined in any way unless they do not exclude each other. In particular, measures including decreasing the number of electrodes in the trenches 108 adjoining the semiconductor diode compared to the number of electrodes in the dense trench transistor cell array, changing the width $w_2$ of the mesa region of the semiconductor diode D compared to the width $w_3$ of the mesa region of the transistor cells C, forming a buried doped zone 136 in the semiconductor diode D, decreasing the depth $d_2$ in the trenches 108 adjoining the semiconductor diode D compared to the depth $d_1$ of the gate trenches 110 in the dense trench transistor cell array may be combined in any way.

In the embodiments described above, an electrical breakdown can be pinned in a center of the mesa region of the semiconductor diode D, i.e. away from a dielectric in the trenches. Thus, charge trapping in the dielectric and interface damages at the dielectric can be counteracted or avoided.

Any of the above described embodiments of dense trench transistor cells and semiconductor diodes may be part of an integrated circuit including further circuit elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a dense trench transistor cell array including a plurality of transistor cells in a semiconductor body, wherein a width w3 of a transistor mesa region of each of the plurality of transistor cells and a width w1 of a first trench of each of the plurality of transistor cells satisfy the following relationship: w3<1.5×w1;
   semiconductor diodes, wherein at least one of the semiconductor diodes is arranged between first and second parts of the plurality of transistor cells and includes a diode mesa region adjoining opposing walls of second trenches; and wherein
   the width w3 of the transistor mesa region and a width w2 of the diode mesa region differ by at least 20%, and wherein a depth $d_1$ of the first trench and a depth $d_2$ of the second trenches differ by at least 20%.

2. The semiconductor device of claim 1, wherein the first trench includes n1 electrodes, wherein n1≥1, and each of the second trenches includes n2 electrodes, wherein n2≤n1−1.

3. The semiconductor device of claim 1, further comprising:
   a semiconductor region of a first conductivity type complementary to a second conductivity type, wherein the semiconductor region adjoins body regions of the plurality of transistor cells and a diode region of the second conductivity type corresponding to one of anode regions and cathode regions of the at least one semiconductor diode; and compensation dopants lowering a net doping in a depth range of the semiconductor region in an area of the at least one semiconductor diode compared to the net doping in a corresponding depth range of the semiconductor region in an area of the plurality of transistor cells.

4. The semiconductor device of claim 3, wherein the compensation dopants lower the net doping in the depth range of the semiconductor region in the area of the semiconductor diodes in a range between 50% to 95% compared to the net doping in a corresponding depth range of the semiconductor region in the area of the plurality of transistor cells.

5. The semiconductor device of claim 1, wherein an electrical breakdown voltage Vbr1 between a body region and a drain region of the dense trench transistor cells and an electrical breakdown voltage Vbr2 between an anode region and a cathode region of the at least one of the semiconductor diodes semiconductor diodes satisfy the following relationship: $5\ V \leq Vbr1-Vbr2 \leq 20\ V$.

6. The semiconductor device of claim 1, further comprising a doped zone buried in at least a part of the semiconductor region in the area of the semiconductor diodes, wherein the doped zone includes a net doping greater than in a surrounding part of the semiconductor region.

7. The semiconductor device of claim 1, wherein a number of dense trench transistor cells arranged between neighboring two of the semiconductor diodes is in a range of 2 to 20.

8. A semiconductor device, comprising:
a dense trench transistor cell array including a plurality of transistor cells in a semiconductor body, wherein a width $w_3$ of a transistor mesa region of each of the plurality of transistor cells and a width $w_1$ of a first trench of each of the plurality of transistor cells satisfy the following relationship: $w3<1.5 \times w_1$; and
semiconductor diodes, wherein at least one of the semiconductor diodes is arranged between first and second parts of the plurality of transistor cells and includes a diode mesa region adjoining opposing walls of second trenches; and wherein
the width $w_3$ of the transistor mesa region and a width $w_2$ of the diode mesa region differ by at least 20%, and the first trench includes $n_1$ electrodes, wherein $n_1 \geq 1$, and each of the second trenches includes n2 electrodes, wherein $n_2 \leq n_1-1$.

9. A semiconductor device, comprising:
a dense trench transistor cell array including a plurality of transistor cells in a semiconductor body, wherein a width $w_3$ of a transistor mesa region of each of the plurality of transistor cells and a width $w_1$ of a first trench of each of the plurality of transistor cells satisfy the following relationship: $w_3<1.5 \times w_1$; and
semiconductor diodes, wherein at least one of the semiconductor diodes is arranged between first and second parts of the plurality of transistor cells and includes a diode mesa region adjoining opposing walls of second trenches; and wherein
the width $w_3$ of the transistor mesa region and a width $w_2$ of the diode mesa region differ by at least 20%; and further comprising
a semiconductor region of a first conductivity type complementary to a second conductivity type, wherein the semiconductor region adjoins body regions of the plurality of transistor cells and a diode region of the second conductivity type corresponding to one of anode regions and cathode regions of the at least one semiconductor diode; and compensation dopants lowering a net doping in a depth range of the semiconductor region in an area of the at least one semiconductor diode compared to the net doping in a corresponding depth range of the semiconductor region in an area of the plurality of transistor cells.

10. The semiconductor device of claim 9, wherein the compensation dopants lower the net doping in the depth range of the semiconductor region in the area of the semiconductor diodes in a range between 50% to 95% compared to the net doping in a corresponding depth range of the semiconductor region in the area of the plurality of transistor cells.

11. A semiconductor device, comprising:
a dense trench transistor cell array including a plurality of transistor cells in a semiconductor body, wherein a width $w_3$ of a transistor mesa region of each of the plurality of transistor cells and a width $w_1$ of a first trench of each of the plurality of transistor cells satisfy the following relationship: $w_3<1.5 \times w_1$;
semiconductor diodes, wherein at least one of the semiconductor diodes is arranged between first and second parts of the plurality of transistor cells and includes a diode mesa region adjoining opposing walls of second trenches; and wherein
the width $w_3$ of the transistor mesa region and a width $w_2$ of the diode mesa region differ by at least 20%, and an electrical breakdown voltage $V_{br1}$ between a body region and a drain region of the dense trench transistor cells and an electrical breakdown voltage $V_{br2}$ between an anode region and a cathode region of the at least one of the semiconductor diodes semiconductor diodes satisfy the following relationship: $5\ V \leq V_{br1}-V_{br2} \leq 20\ V$.

\* \* \* \* \*

UNITED STATES PATENT AND TRADEMARK OFFICE
CERTIFICATE OF CORRECTION

PATENT NO. : 9,165,921 B2  
APPLICATION NO. : 13/716784  
DATED : October 20, 2015  
INVENTOR(S) : P. Nelle et al.

Page 1 of 1

It is certified that error appears in the above-identified patent and that said Letters Patent is hereby corrected as shown below:

Claims

Column 9, lines 20, 21 (claim 5, lines 5, 6) please change "the semiconductor diodes semiconductor diodes satisfy" to -- the semiconductor diodes satisfy --

Column 9, line 37 (claim 8, line 7) please change "w3<" to -- $w_3$< --

Column 9, line 46 (claim 8, line 16) please change "includes n2" to -- includes $n_2$ --

Column 10, lines 49, 50 (claim 11, lines 19, 20) please change "the semiconductor diodes semiconductor diodes satisfy" to -- the semiconductor diodes satisfy --

Signed and Sealed this  
Twenty-ninth Day of March, 2016

Michelle K. Lee  
*Director of the United States Patent and Trademark Office*

UNITED STATES PATENT AND TRADEMARK OFFICE
CERTIFICATE OF CORRECTION

PATENT NO. : 9,165,921 B2
APPLICATION NO. : 13/716784
DATED : October 20, 2015
INVENTOR(S) : P. Nelle et al.

Page 1 of 1

It is certified that error appears in the above-identified patent and that said Letters Patent is hereby corrected as shown below:

Title Page, (73) Assignee, please change "Infineon Technology" to -- Infineon Technologies --

Signed and Sealed this
Twenty-eighth Day of June, 2016

Michelle K. Lee
*Director of the United States Patent and Trademark Office*